(12) United States Patent
Filippi et al.

(10) Patent No.: US 7,560,375 B2
(45) Date of Patent: Jul. 14, 2009

(54) GAS DIELECTRIC STRUCTURE FORMING METHODS

(75) Inventors: Ronald G. Filippi, Wappingers Falls, NY (US); Roy C. Iggulden, Newburgh, NY (US); Edward W. Kiewra, Verbank, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,697

(22) Filed: Sep. 30, 2004

(65) Prior Publication Data

US 2006/0073695 A1 Apr. 6, 2006

(51) Int. Cl.
*H01L 21/4763* (2006.01)

(52) U.S. Cl. ............ 438/619; 438/618; 438/620; 438/622; 438/631; 438/637; 438/638; 438/639

(58) Field of Classification Search ......... 438/618–620, 438/622, 631, 637–639
See application file for complete search history.

(56) References Cited

U.S. PATENT DOCUMENTS

| 4,561,173 | A | * | 12/1985 | Te Velde ............... 438/619 |
| 5,949,143 | A |   | 9/1999 | Bang |
| 6,104,077 | A |   | 8/2000 | Gardner et al. |
| 6,204,143 | B1 | * | 3/2001 | Roberts et al. ........... 438/396 |
| 6,214,727 | B1 | * | 4/2001 | Parekh ................. 438/666 |
| 7,228,763 | B2 | * | 5/2001 | Lee ..................... 438/639 |
| 6,329,279 | B1 |   | 12/2001 | Lee |
| 6,359,328 | B1 | * | 3/2002 | Dubin ................. 257/622 |
| 6,440,839 | B1 |   | 8/2002 | Partovi et al. |
| 6,635,967 | B2 |   | 10/2003 | Chang et al. |
| 6,875,685 | B1 | * | 4/2005 | Furukawa et al. ........ 438/619 |
| 7,094,669 | B2 | * | 8/2006 | Bu et al. ................ 438/462 |
| 2001/0054764 | A1 | * | 12/2001 | Nitta et al. ............. 257/750 |
| 2002/0081787 | A1 |   | 6/2002 | Kohl et al. |
| 2003/0077897 | A1 | * | 4/2003 | Tsai et al. ............. 438/633 |
| 2004/0018714 | A1 | * | 1/2004 | Cooney et al. .......... 438/618 |
| 2004/0058526 | A1 | * | 3/2004 | Cowley et al. .......... 438/637 |
| 2005/0230836 | A1 | * | 10/2005 | Clarke et al. ........... 257/760 |
| 2006/0019482 | A1 | * | 1/2006 | Su et al. ............... 438/618 |

* cited by examiner

*Primary Examiner*—Kevin M Picardat
*Assistant Examiner*—Bac H Au
(74) *Attorney, Agent, or Firm*—Joseph Petrokaitis; Hoffman Warnick LLC

(57) ABSTRACT

Methods of forming a gas dielectric structure for a semiconductor structure by using a sacrificial layer. In particular, one embodiment of the invention includes forming an opening for semiconductor structure in a dielectric layer on a substrate; depositing a sacrificial layer over the opening; performing a directional etch on the sacrificial layer to form a sacrificial layer sidewall on the opening; depositing a conductive liner over the opening; depositing a metal in the opening; planarizing the metal and the conductive liner; removing the sacrificial layer sidewall to form a void; and depositing a cap layer over the void to form the gas dielectric structure. The invention is easily implemented in damascene wire formation processes, and improves structural stability.

12 Claims, 9 Drawing Sheets

GAS DIELECTRIC STRUCTURE FORMING METHODS

BACKGROUND OF THE INVENTION

1. Technical Field

The present invention relates generally to semiconductor structures, and more particularly, to methods of forming a gas dielectric structure for a semiconductor structure.

2. Related Art

In order to enhance semiconductor chip operational speed, semiconductor devices have been continuously scaled down in size. Unfortunately, as semiconductor device size is decreased, the capacitive coupling between conductors in a circuit tends to increase since the capacitive coupling is inversely proportional to the distance between the conductors. This coupling may ultimately limit the speed of the chip or otherwise inhibit proper chip operation if steps are not taken to reduce the capacitive coupling.

The capacitance between conductors is also dependent on the insulator, or dielectric, used to separate the conductors. Traditional semiconductor fabrication commonly employs silicon dioxide ($SiO_2$) as a dielectric, which has a dielectric constant (k) of approximately 3.9. One challenge facing further development is finding materials with a lower dielectric constant that can be used between the conductors. As the dielectric constant of such materials is decreased, the speed of performance of the chip is increased. Some new low-k dielectric materials that have been used to provide a lower dielectric constant between conductors include, for example, fluorinated glass and organic materials. Unfortunately, provision of newer low-k dielectric materials presents a number of new challenges, which increase process complexity and cost.

Implementation of organic materials to reduce the dielectric constant also reduces the overall back-end-of-line (BEOL) capacitance. Unfortunately, organic materials suffer from temperature limitations, shrinkage or swelling during manufacturing or chip operation, and poor structural integrity. Instead of using $SiO_2$ and organic materials, another approach is to implement gas, such as air, which is provided in the form of a gas dielectric structure in a semiconductor structure. Simple capacitance modeling of parallel wires shows that even a small air-gap near the wire results in a significant improvement in the overall dielectric constant (k) for a structure, e.g., a 10% air gap per edge will reduce the effective dielectric constant of a dielectric by approximately 15%. Current processing for implementing gas dielectric structure, however, is fairly complex and cannot be easily integrated into conventional damascene wire formation. Damascene wire formation is a process in which interconnect metal lines are delineated in dielectrics isolating them from each other following lithography and etching by means of chemical-mechanical planarization (CMP). In this process, an interconnect pattern is first lithographically defined in the layer of dielectric, metal is then deposited to fill resulting trenches and then excess metal is removed by means of chemical-mechanical polishing (planarization). Typically gas dielectric formation requires additional masking layers for reactive ion etching (RIE) processing steps relative to damascene wire formation. In addition, application of simple gas dielectric structures tends to create sagging of long line conductors as well as producing poor structural stability.

Accordingly, a need has developed in the art for an improved method of forming a gas dielectric structure for a semiconductor structure.

SUMMARY OF THE INVENTION

The invention includes methods of forming a gas dielectric structure for a semiconductor structure by using a sacrificial layer. In particular, one embodiment of the invention includes forming an opening for semiconductor structure in a dielectric layer on a substrate; depositing a sacrificial layer over the opening; performing a directional etch on the sacrificial layer to form a sacrificial layer sidewall on the opening; depositing a first liner over the opening; depositing a metal in the opening; planarizing the metal and the first liner; removing the sacrificial layer sidewall to form a void; and depositing a cap layer over the void to form the gas dielectric structure. The invention is easily implemented in damascene wire formation processes, and improves structural stability.

A first aspect of the invention is directed to a method of forming a gas dielectric structure for a semiconductor structure, the method comprising the steps of: forming an opening for semiconductor structure in a dielectric layer on a substrate; depositing a sacrificial layer over the opening; performing a directional etch on the sacrificial layer to form a sacrificial layer sidewall on the opening; depositing a conductive liner over the opening; depositing a metal in the opening; planarizing the metal and the conductive liner; removing the sacrificial layer sidewall to form a void; and depositing a cap layer over the void to form the gas dielectric structure.

A second aspect of the invention is directed to a method of forming a gas dielectric structure for a semiconductor structure, the method comprising the steps of: performing a dual damascene process to form an opening including at least one wiring opening and at least one via in a dielectric layer on a substrate; depositing a sacrificial layer over the opening; performing a directional etch on the sacrificial layer to form a sacrificial layer sidewall; depositing a conductive liner over the opening; depositing a metal in the opening; planarizing the metal and the conductive liner; removing the sacrificial layer sidewall to form a void; and depositing a cap layer over the void to form the gas dielectric structure.

A third aspect of the invention is directed to a method of forming a gas dielectric structure for a semiconductor structure, the method comprising the steps of: performing a via-first dual damascene process to form an opening including at least one wiring opening and at least one via in a dielectric layer on a substrate; depositing a non-conductive liner over the opening; depositing a sacrificial layer over the opening; performing a directional etch on the sacrificial layer to form a sacrificial layer sidewall; depositing a conductive liner over the opening; depositing a metal in the opening; planarizing the metal and the conductive liner; removing the sacrificial layer sidewall to form a void that extends along a side of the at least one via; and depositing a cap layer over the void to form the gas dielectric structure.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Referring to FIGS. 1-9, methods of forming a gas dielectric structure for a semiconductor structure will now be described.

Figure 1:
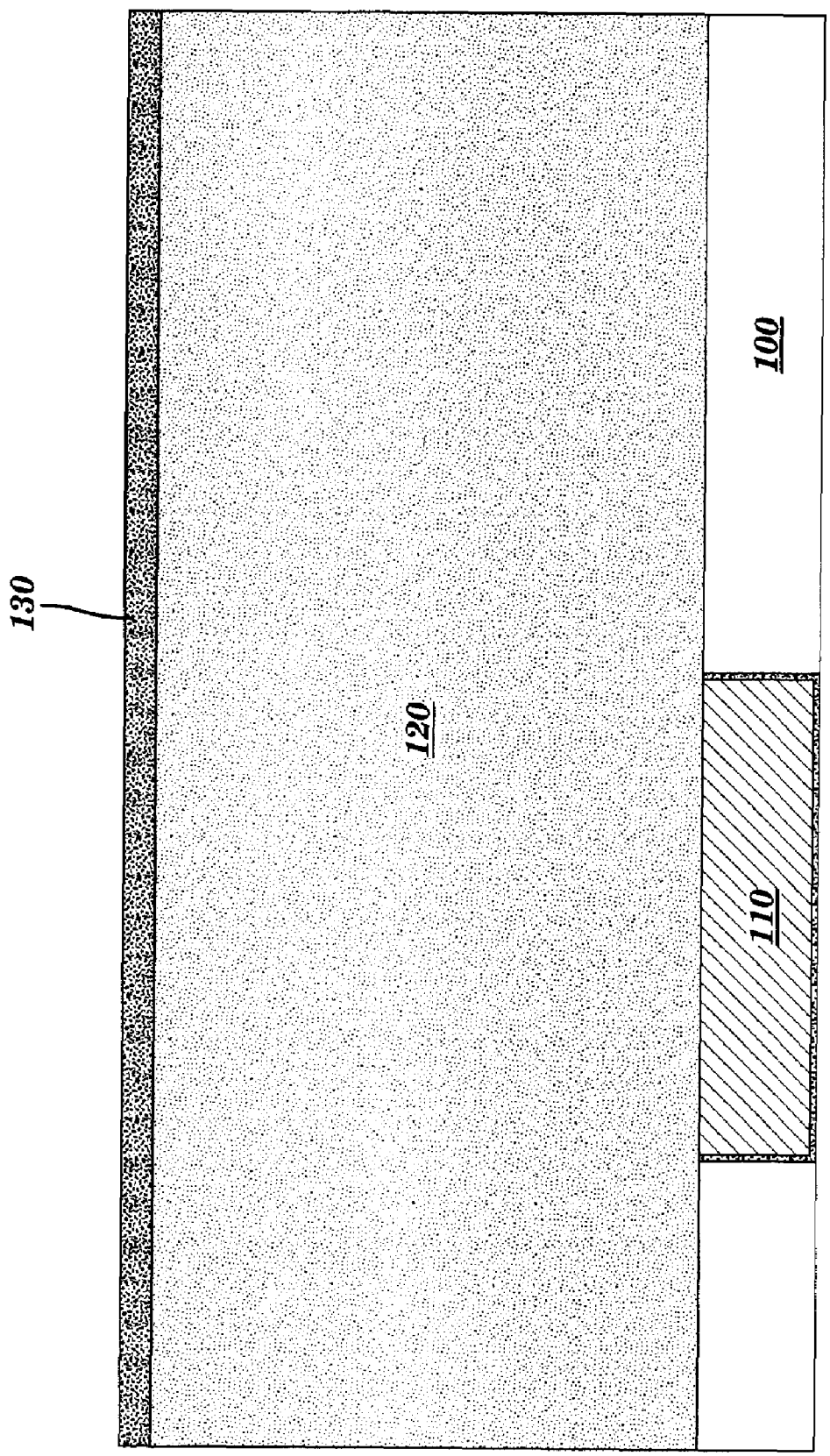
FIGS. 1-7 shows steps of methods of forming a gas dielectric structure for a semiconductor structure according to the invention.

As shown in FIG. 1, a substrate 100, e.g., bulk silicon or silicon-on-insulator (SOI), with any typical conductor line 110 or active area, etc., patterned therein is provided. A dielectric layer 120 is also deposited thereon. Dielectric layer 120 can include any of numerous dielectric materials including but not limited to: silicon dioxide ($SiO_2$), fluorinated $SiO_2$, Silk™ available from Dow, SiCOH (carbon-doped oxide), Black Diamond™ available from Applied Materials, etc. A hard mask layer 130 can also be deposited on top of dielectric layer 120. Hard mask layer 130 can include any of numerous hard masks including but not limited to: $SiO_2$, silicon nitride (SiN), oxynitride, blok, n-blok, etc.

Figure 2:
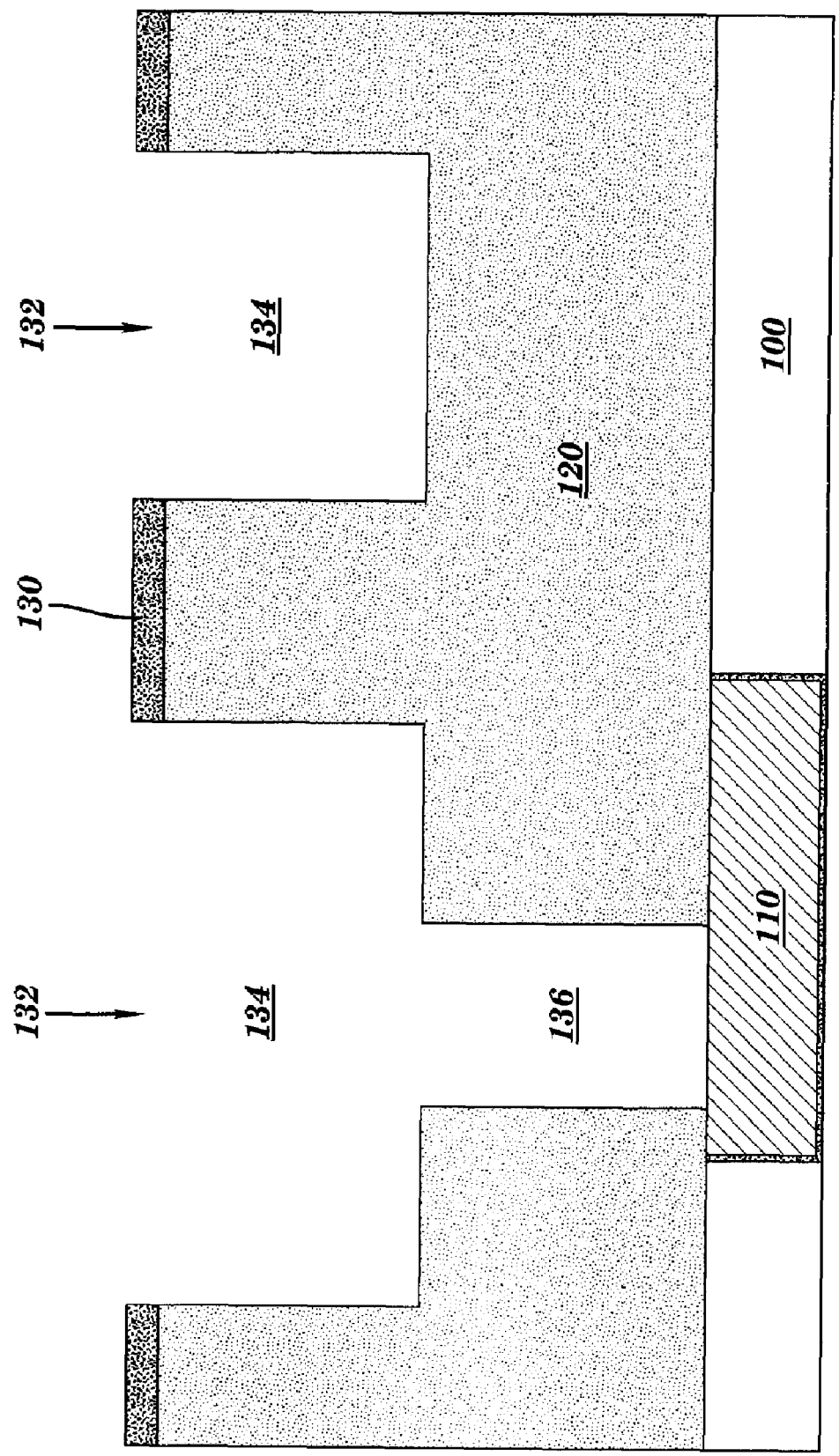

As shown in FIG. 2, a first step includes forming an opening 132 for a semiconductor structure in dielectric layer 120 on substrate 100. As illustrated, in one embodiment, the forming step includes opening 132 with at least one wiring line opening 134 and at least one via 136 by patterning wiring line areas 134 and via areas 136 into dielectric layer 120 and hard mask layer 130, and etching to form opening 132. This step may be implemented by any conventional dual damascene processing. Alternatively, it should be recognized that this step could be implemented using a single damascene processing.

Figure 3:
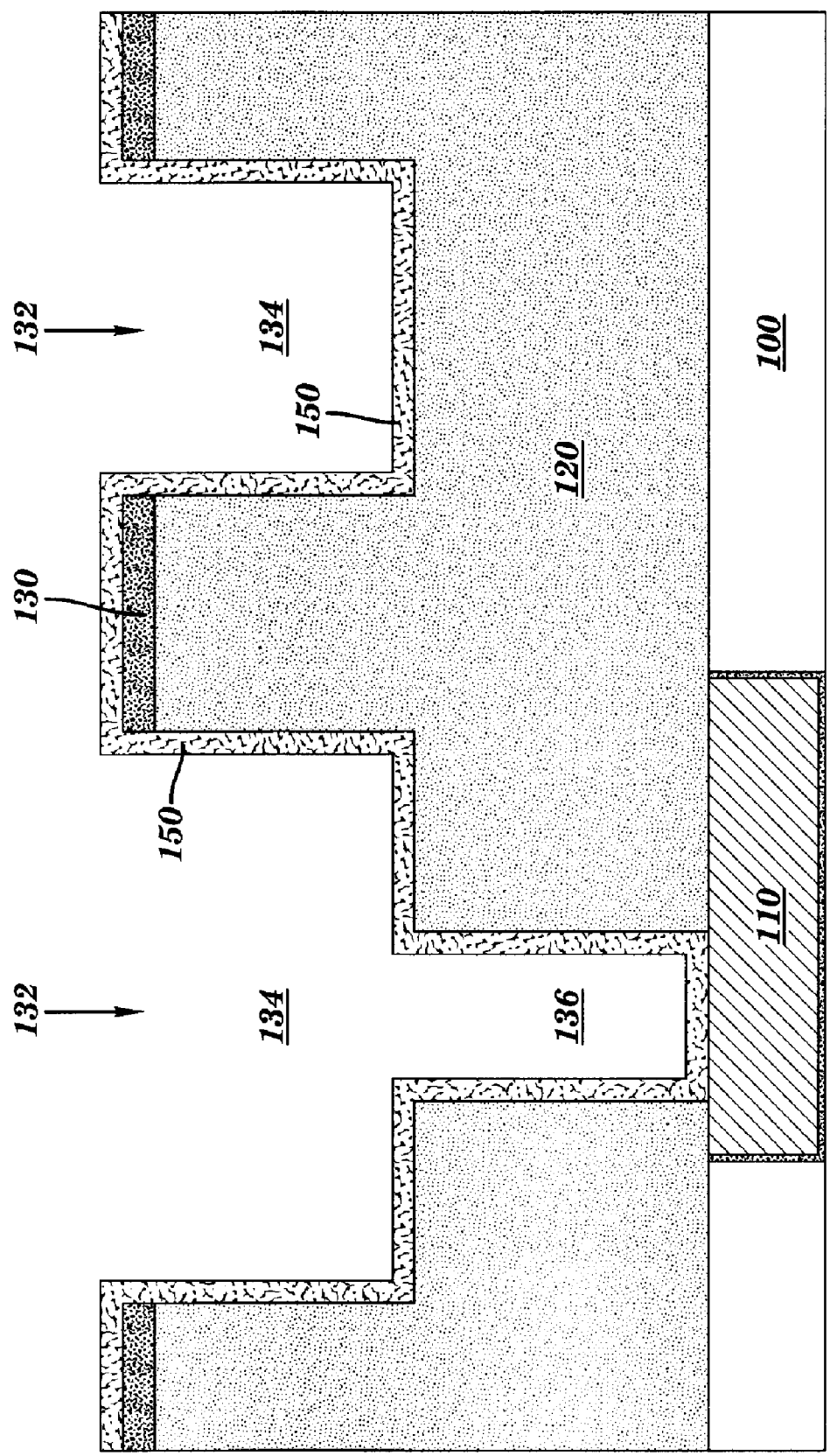

Next, as shown in FIG. 3, a sacrificial layer 150 is deposited over opening 132. Sacrificial layer 150 can include any of numerous materials. In one embodiment, where wiring is to be copper, sacrificial layer 150 includes: aluminum (Al), $SiO_2$ or titanium (Ti). However, other materials may be used.

Figure 4:
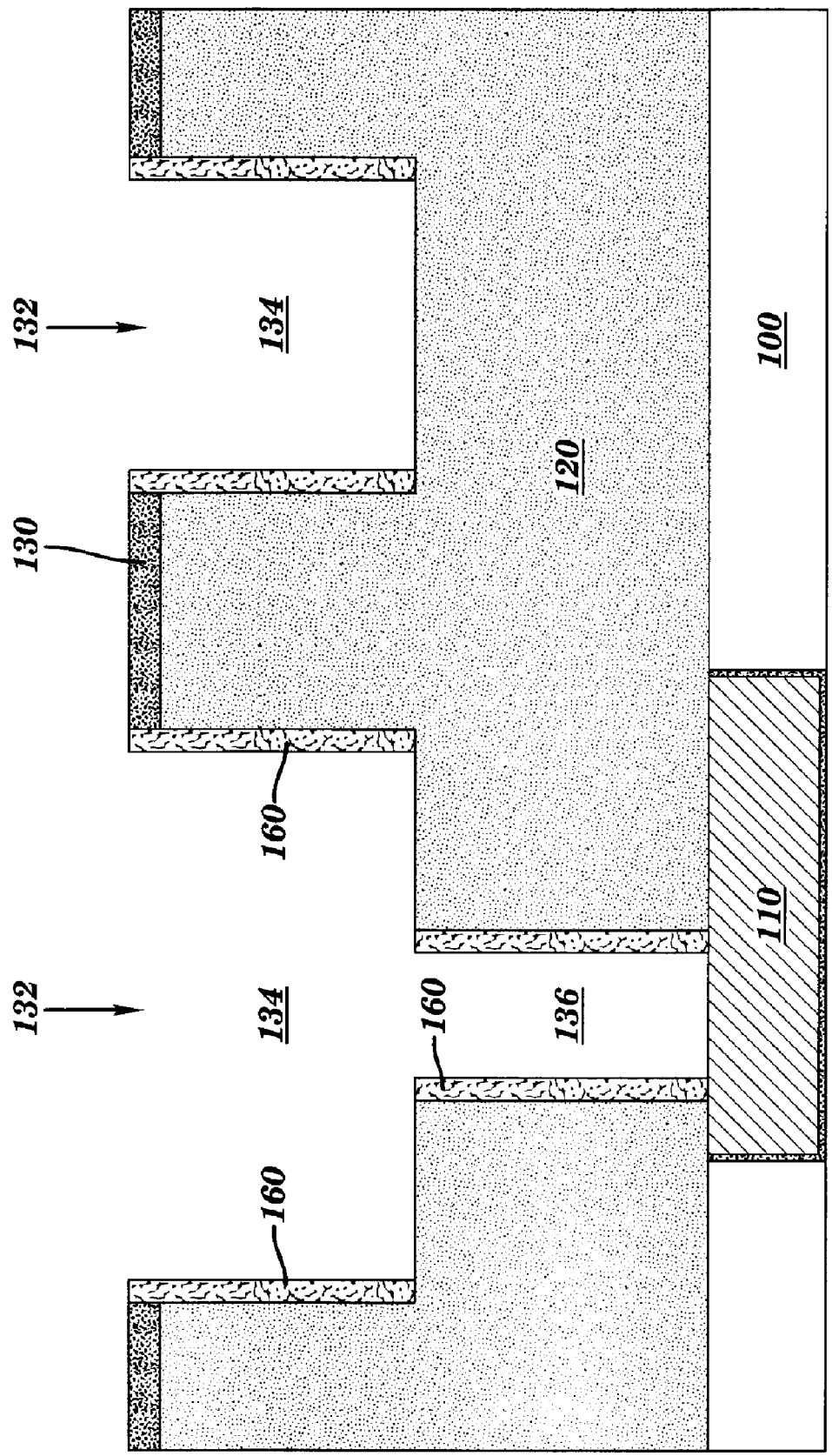

FIG. 4 shows a next step in which a directional etch is conducted on sacrificial layer 150 (FIG. 3) to form a sacrificial layer sidewall 160. This step leaves sacrificial layer on sidewalls of wiring line areas 134 and via areas 136, but removes it from the bottom of wiring line areas 134 and via areas 136. The directional etch can be conducted according to any conventional process.

Figure 5:
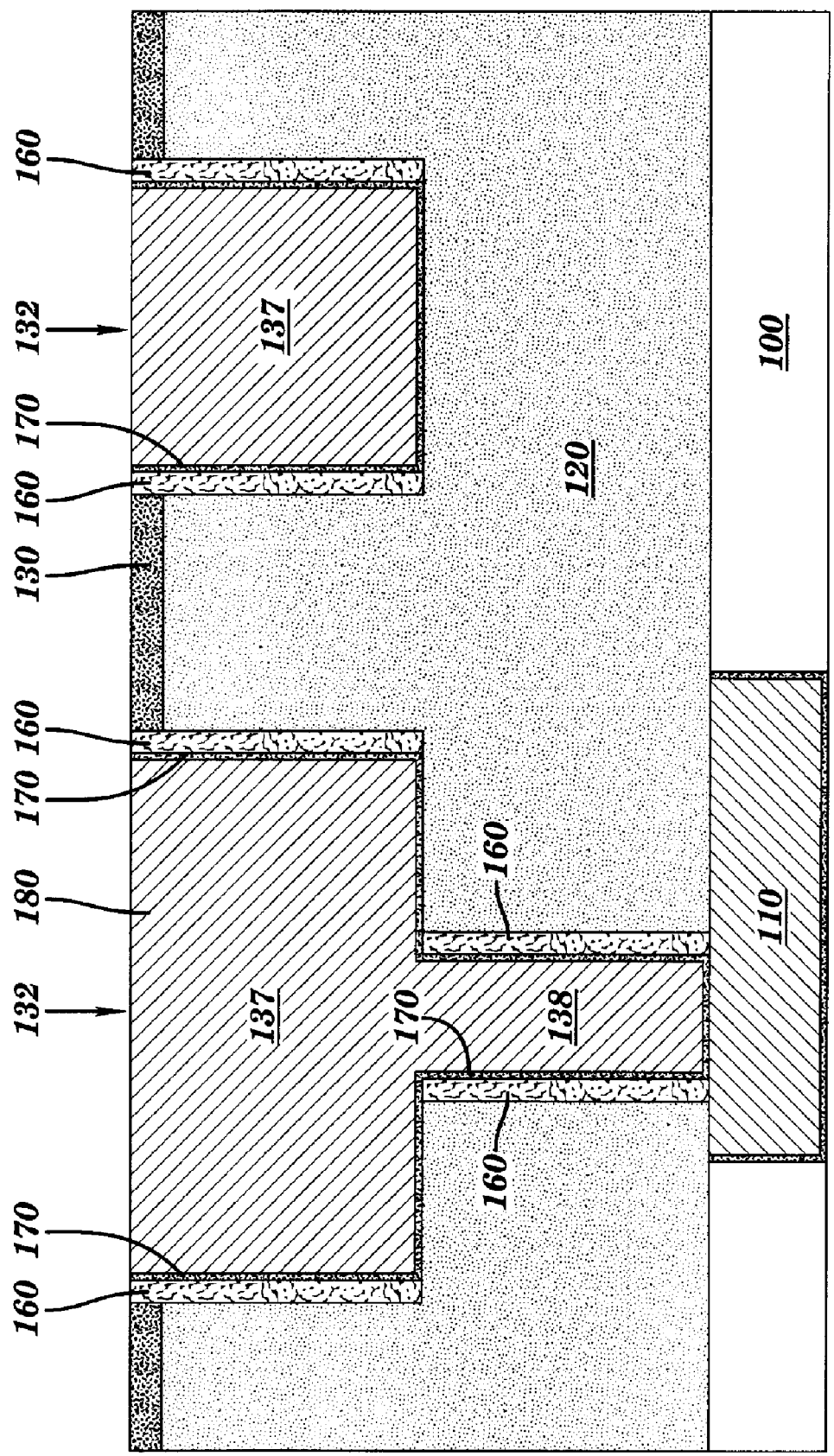

Referring to FIG. 5, a conductive liner 170 is then deposited over opening 132. Conductive liner 170 can include but is not limited to tantalum (Ta), tantalum nitride (TaN), titanium (Ti), titanium nitride (TiN), tungsten (W), niobium (Nb), etc. Conductive liner 170 can be formed as a single liner or a multi-layer liner of one or more materials. FIG. 5 also shows depositing a metal 180 in opening 132 to form wires 137 and/or vias 138. Metal layer 180 can include any of numerous metal layers including but not limited to: copper (Cu), aluminum (Al), gold (Au), silver (Ag), or alloys thereof. As also shown in FIG. 5, conductive liner 170 and metal 180 are planarized, e.g., by chemical mechanical polishing (CMP), to form patterned dual damascene structures.

Figure 6:
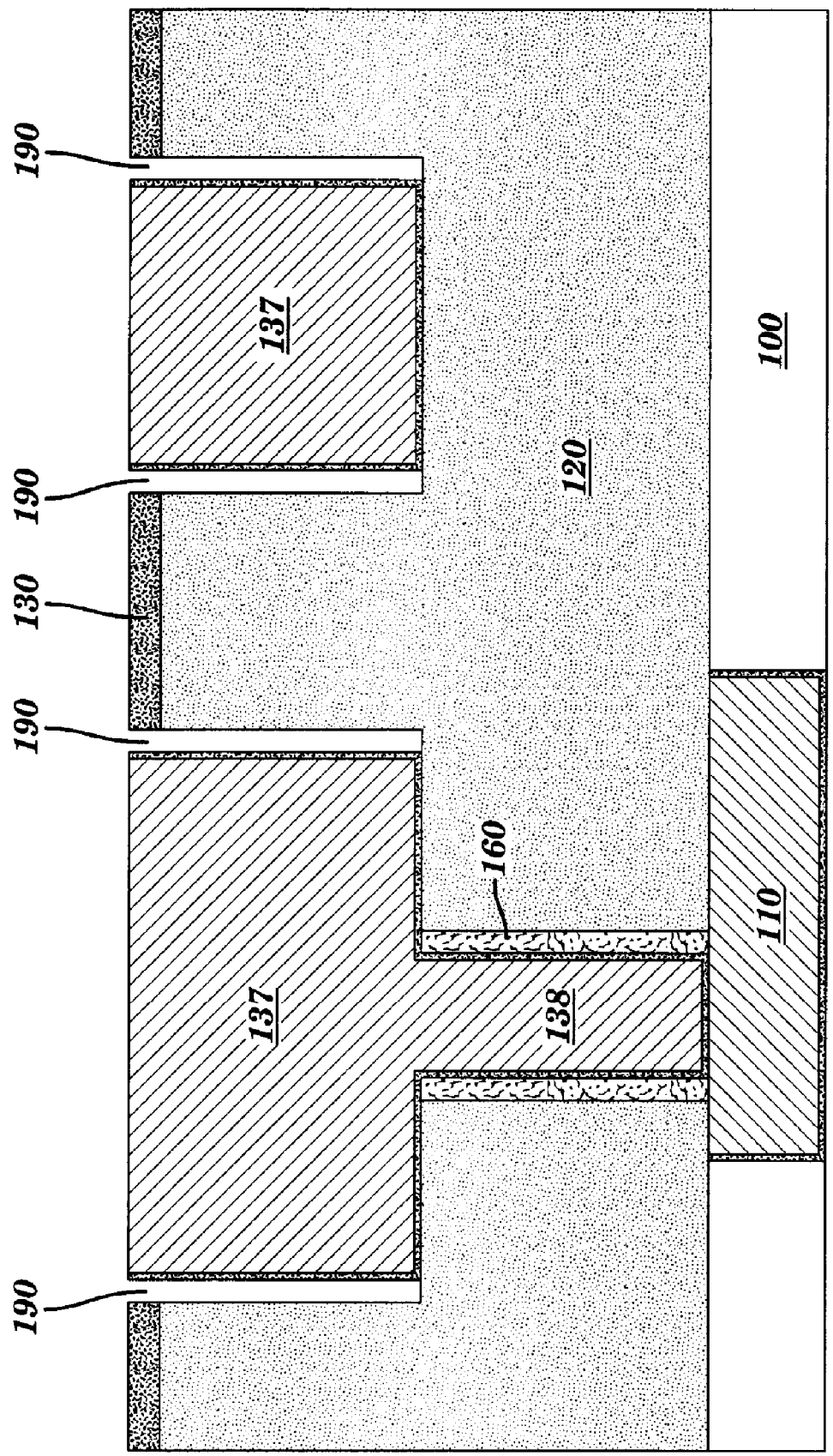
Figure 9:
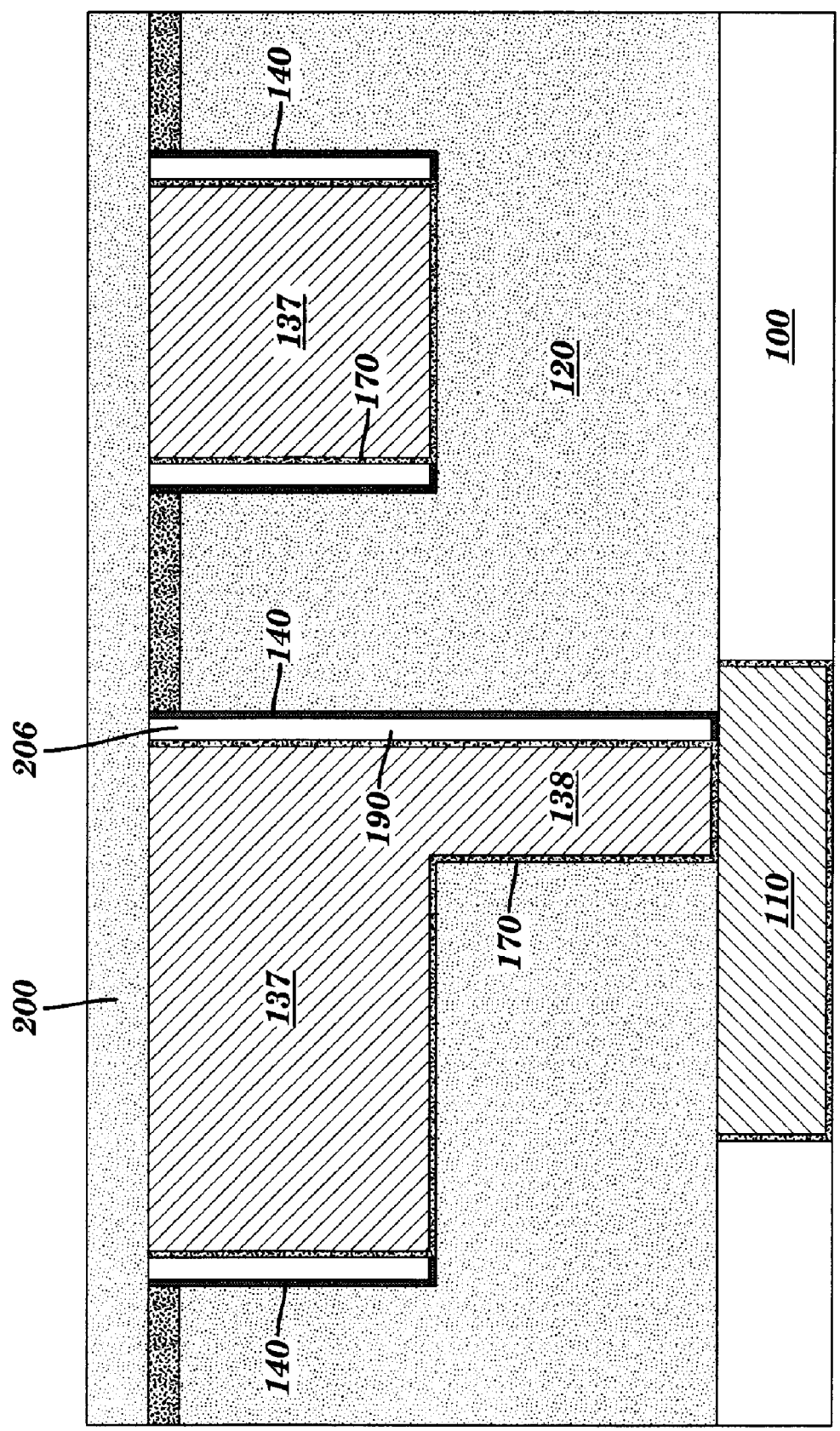
FIG. 9 shows an alternative step of the methods.

Next, as shown in FIG. 6, sacrificial layer sidewall 160 is removed to form a void 190 adjacent a wire 137 and/or a via 138 (see FIG. 9). Removal may be by a wet or dry selective etch from wire 137 sides to form air gap 190. In one embodiment, the removing step may include etching the sacrificial sidewall layer using one of: a) water ($H_2O$) and sodium hydroxide (NaOH); b) water ($H_2O$) and hydrofluoric acid (HF); and c) HF and hydrochloric acid (HCl). Where $H_2O$ and NaOH are used as an etchant, the ratio of $H_2O$ to NaOH is preferably no greater than approximately 10:1 and no less than 1:1. The following table shows some illustrative materials that can be used as sacrificial layer 150, dielectric layer 120 and etchants. Each etchant is selective to the other contact points. The sacrificial layer and etchant materials are not limited to these and can be one of countless combinations. This table is just an illustrative example.

| Sacrificial Layer | ILD | Etchant |
| --- | --- | --- |
| aluminum (Al) | silicon dioxide ($SiO_2$) | $H_2O$ + NaOH (10:1) |
| aluminum (Al) | $SiO_2$ | $H_2O$ + NaOH (1:1) |
| $SiO_2$ | low-k material | $H_2O$ + HF (1:1) |
| $SiO_2$ | low-k material | HF + HCl (1:1) |

Figure 7:
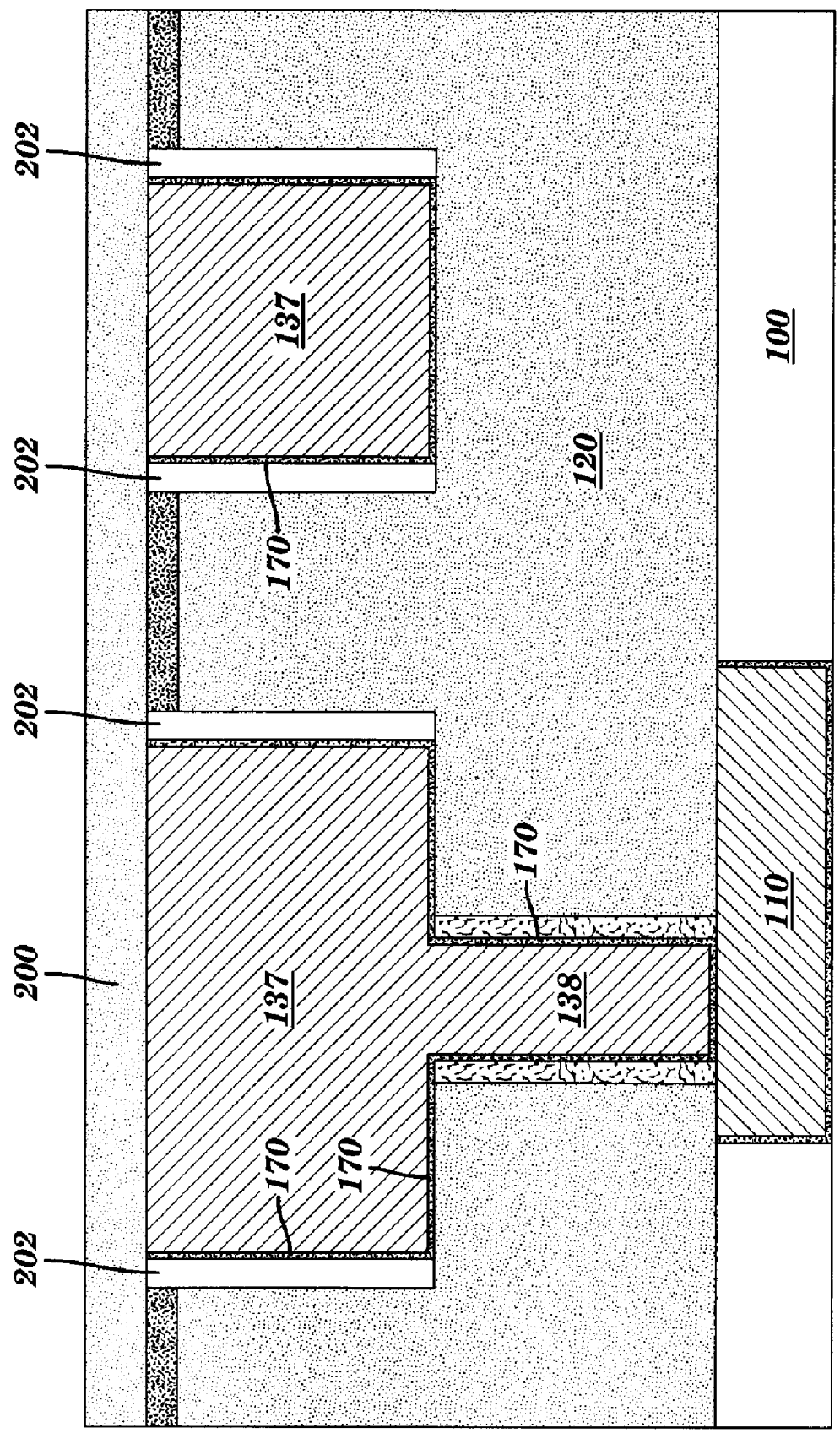

As shown in FIG. 7, a final step includes depositing a cap layer 200 over void 190 (FIG. 6) to form a gas dielectric structure 202. As shown in FIG. 7, cap layer 200 does not extend far into air gap structure 202.

Figure 8:
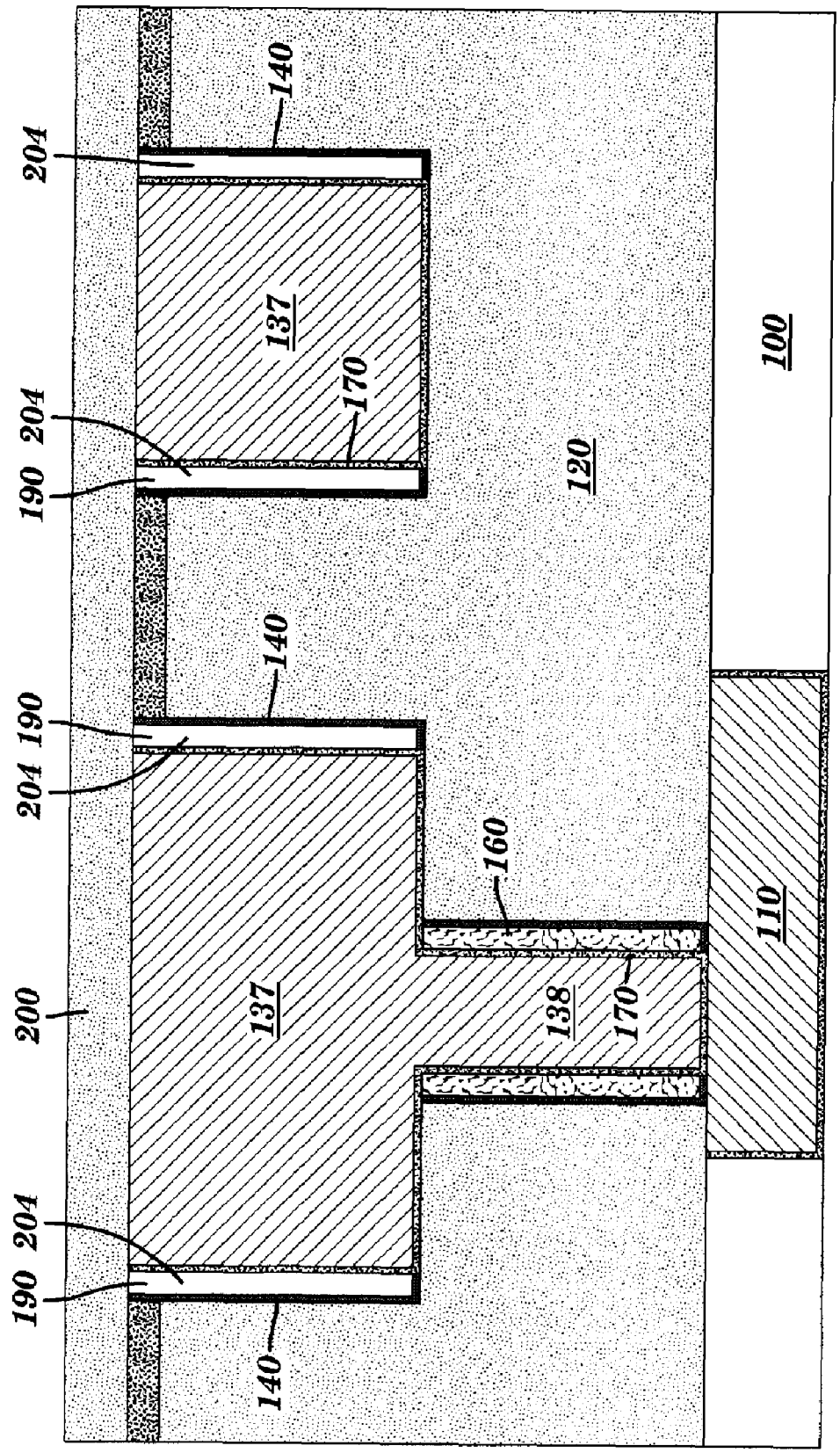
FIG. 8 shows an alternative step of the methods.

FIG. 8 illustrates a gas dielectric structure 204 including an alternative embodiment in which a non-conductive liner 140 is formed within opening 132, which is deposited prior to deposition of the sacrificial layer (see FIG. 2). In this case, sacrificial layer 150 is deposited next to non-conductive layer 140, and conductive liner 170 is adjacent wire 137 and/or via 138. Non-conductive liner 140 may include, for example, silicon nitride ($Si_3N_4$), silicon dioxide ($SiO_2$) or other insulating materials.

It should be understood that the same benefit can be obtained with a single damascene process in which the line and vias are formed in separate process steps. In this case, the air gap structure would be present at both via and line levels.

FIG. 9 shows an embodiment in which a via-first dual damascene application is used. In this case, void 190 extends along a side of at least one via 138, such that an extended gas dielectric structure 206 is formed. Accordingly, in cases where a via-first dual damascene process is implemented, the invention allows for void 190 and thus gas dielectric structure 206 to be formed in via 138. FIG. 9 also shows the optional non-conducive liner 140, which is not required.

The above-described methods can be repeated for any subsequent layers. Since the above-described methods only create a thin gas dielectric structure 202, 204, 206 adjacent to wire 137 and/or via 138, there still exists sufficient dielectric layer 120 material outside wire 137 to provide mechanical stability for improved reliability during operation, e.g., thermal cycle reliability.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a gas dielectric structure for a semiconductor structure, the method comprising:

forming an opening for semiconductor structure in a dielectric layer on a substrate, wherein the opening includes both a wiring opening and a via opening, wherein the via provides a vertical connection to an interconnect line;

depositing a non-conductive liner, wherein the non-conductive liner includes one of the group consisting of: silicon nitride ($Si_3N_4$) and silicon dioxide ($SiO_2$);

after depositing the non-conductive liner, depositing a sacrificial layer over the opening such that the sacrificial layer fails to substantially fill the opening;

performing a directional etch on the sacrificial layer to form a sacrificial layer sidewall on the opening after depositing the sacrificial layer;

depositing a conductive liner over the opening after performing the directional etch;

depositing a metal in the opening after depositing the conductive liner to form a wire and a contact via;

planarizing the metal and the conductive liner after depositing the metal;

removing the sacrificial layer sidewall using a dry etching process, after the metal and the conductive liner are planarized, forming a void, wherein the void extends along a side of the contact via and the wire; and depositing a cap layer over the void to form the gas dielectric structure.

2. The method of claim 1, wherein the forming step includes performing a dual damascene process.

3. The method of claim 1, wherein the forming step includes depositing a hard mask, patterning the hard mask and etching the hard mask.

4. The method of claim 1, wherein the conductive liner includes at least one of the group consisting of: tantalum (Ta), tantalum nitride (TaN), titanium (Ti), titanium nitride (TiN), tungsten (W) and niobium (Nb).

5. The method of claim 1, wherein the sacrificial layer includes one of the group consisting of: aluminum (Al) and silicon dioxide ($SiO_2$).

6. A method of forming a gas dielectric structure for a semiconductor structure, the method comprising:

performing a dual damascene process to form an opening including both a wiring opening and a via opening in a dielectric layer on a substrate, wherein the via provides a vertical connection to an interconnect line;

depositing a non-conductive liner, wherein the non-conductive liner includes one of the group consisting of: silicon nitride ($Si_3N_4$) and silicon dioxide ($SiO_2$);

after depositing the non-conductive liner, depositing a sacrificial layer over the opening;

performing a directional etch on the sacrificial layer to form a sacrificial layer sidewall wherein the directional etching removes the sacrificial layer only from substantially horizontal surfaces;

depositing a conductive liner over the opening after performing the directional etch;

depositing a metal in the opening after depositing the conductive liner to form a wire and a contact via;

planarizing the metal and the conductive liner after depositing the metal;

removing the sacrificial layer sidewall using a dry etching process, after the metal and the conductive liner are planarized, forming a void, wherein the void extends along a side of the contact via; and depositing a cap layer over the void to form the gas dielectric structure.

7. The method of claim 6, wherein the forming step includes depositing a hard mask, patterning the hard mask and etching the hard mask.

8. The method of claim 6, wherein the conductive liner includes at least one of the group consisting of: tantalum (Ta), tantalum nitride (TaN), titanium (Ti), titanium nitride (TiN), tungsten (W) and niobium (Nb).

9. The method of claim 6, wherein the sacrificial layer includes one of the group consisting of: aluminum (Al) and silicon dioxide ($SiO_2$).

10. A method of forming a gas dielectric structure for a semiconductor structure, the method comprising:

performing a via-first dual damascene process to form an opening including both a wiring opening and a via opening in a dielectric layer on a substrate, wherein the via provides a vertical connection between to an interconnect line;

depositing a non-conductive liner, wherein the non-conductive liner includes one of the group consisting of: silicon nitride ($Si_3N_4$) and silicon dioxide ($SiO_2$);

after depositing the non-conductive liner, depositing a sacrificial layer over the opening such that the sacrificial layer fails to substantially fill the opening;

performing a directional etch on the sacrificial layer to form a sacrificial layer sidewall, wherein the directional etching removes the sacrificial layer only from substantially horizontal surfaces;

depositing a conductive liner over the opening after performing the directional etch;

depositing a metal in the opening after depositing the conductive liner to form a wire and a contact via;

planarizing the metal and the conductive liner after depositing the metal;

removing the sacrificial layer sidewall using a dry etching process, after the metal and conductive liner are planarized, forming a void that extends along a side of the contact via; and depositing a cap layer over the void to form the gas dielectric structure.

11. The method of claim 10, wherein the conductive liner includes one of the group consisting of: tantalum (Ta), tantalum nitride (TaN), titanium (Ti), titantium nitride (TiN), tungsten (W) and niobium (Nb).

12. The method of claim 10, wherein the sacrificial layer includes one of the group consisting of: aluminum (Al) and silicon dioxide ($SiO_2$).

* * * * *